United States Patent
Fang

(10) Patent No.: US 6,713,870 B2
(45) Date of Patent: Mar. 30, 2004

(54) WAFER LEVEL CHIP-SCALE PACKAGE

(75) Inventor: Jen-Kuang Fang, Kaoshiung (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 0 days.

(21) Appl. No.: 10/382,029

(22) Filed: Mar. 4, 2003

(65) Prior Publication Data

US 2003/0168734 A1 Sep. 11, 2003

(30) Foreign Application Priority Data

Mar. 6, 2002 (TW) .......................... 091104227

(51) Int. Cl.$^7$ .......................... H01L 23/48; H01L 23/52; H01L 29/40

(52) U.S. Cl. .................. 257/734; 257/737; 257/778; 257/784

(58) Field of Search ......................... 257/734, 737, 257/738, 778, 779, 780, 781, 784

(56) References Cited

U.S. PATENT DOCUMENTS

| 6,287,893 B1 | * | 9/2001 | Elenius et al. ............... 438/108 |
| 6,300,234 B1 | * | 10/2001 | Flynn et al. ................. 438/612 |
| 6,429,532 B1 | * | 8/2002 | Han et al. .................... 257/781 |
| 6,501,169 B1 | * | 12/2002 | Aoki et al. .................. 257/700 |

* cited by examiner

Primary Examiner—Wael M. Fahmy
Assistant Examiner—Hoai Pham
(74) Attorney, Agent, or Firm—Seyfarth Shaw LLP

(57) ABSTRACT

A wafer level chip-scale package comprises a chip including a plurality of metal pads individually formed on each of the bonding pads. In the same metal circuit layer where metal pads exist, bump pads are arranged in a matrix configuration, wherein almost all of them are electrically connected one by one to bonding pads through connection traces. Bump pad isolated by lacking connection trace has an extension portion of itself, and the resilient passivation layer does not overlay the bump pad and extension portion. There is a metal wire used to connect the extension portion of the bump pad with the corresponding metal pad, which is also not overlaid by the resilient passivation layer. Therefore, the metal wire can directly cross over other connection traces to achieve the electrical connection on a shorter route.

8 Claims, 3 Drawing Sheets

WAFER LEVEL CHIP-SCALE PACKAGE

BACKGROUND OF THE INVENTION

1. Field of the Invention

The present invention relates to a wafer level chip-scale package, more specifically, to a package employing under bump metallurgies as bonding pads for the wire bonding process.

2. Description of the Related Art

IC technology has forged ahead in the past decade to satisfy the requirements of fast transmitting speed, excellent heat dissipation, smaller overall sizes and lighter weight. With these goals in mind, many IC engineers have developed wafer level chip-scale packages to take full aforementioned advantages and have other merits, such as a lower manufacturing cost and overall package dimensions substantially equal to that of a chip enclosed within the package.

FIG. 1 is a diagrammatic top view of the bonding pad layout of a conventional chip. A chip 10 comprises a plurality of bonding pads 11 which are distributed and arranged around the chip 10. From the disclosure of the wafer level chip-scale packaging technique, a metal layer is further formed on the surface of the chip 10, and the pads 11 are reconnected to corresponding bump pads from the periphery toward the center of the chip (not shown). The corresponding manufacturing process is referred to in the I/O pad (or bonding pads) redistribution technique.

FIG. 2 is a diagrammatic top view of the I/O pad redistribution layout of a conventional chip. Also referring to FIG. 3 showing a cross-sectional view of FIG. 2, a metal circuit layer is provided on a bonding pad 33 and a passivation layer 32 of a chip 20, wherein the metal circuit layer individually form metal pads 22 on each of peripheral bonding pads 33. The metal pad 22 is electrically connected to a bump pad 23 through a connection trace 21. In almost all embodiments, the bump pad 23 is arranged in a matrix configuration.

As shown in FIG. 3, the metal circuit layer is overlaid with a resilient passivation layer 31 thereon, wherein the resilient passivation layer 31 has resilient holes. Each bump pad 23 is associated with one of the resilent hole to expose itself therein. Finally, the bump pad 23 is needed to bump a solder ball or electroplate a copper rod as a contact with a flip-chip substrate (not shown), and the resilient passivation layer 31 can absorb and suppress the mechanical stress induced from the flip-chip substrate.

As shown in FIG. 2, a higher trace density in the metal circuit layer is accompanied with an increased number of bonding pads 33 on a same chip. That is, the width and pitch of connection traces 21 are reduced so that the trace layout on redistribution processes is more difficult than before. In some practical cases, the connection trace 21 is required to have a circuitous route to accomplish the redistribution of the bonding pad 33. Because there are a lot of limitations for the circuit in high-speed signal transmission, such as impedance match, self-inductance, cross-inductance and cross talk, the trace layout based on these complex considerations are considered as try and error procedure in design.

FIG. 4 is a diagrammatic partial view of the circuit in accordance with conventional bonding pad redistribution. A metal pad 411 is electrically connected to a bump pad 421 located at an inner area through a connection trace 431, and a metal pad 412 is also electrically connected to a bump pad 422 adjacent to the bump pad 421 through the connection trace 432. Because each of the contacts of the flip-chip substrate is well assigned with an electrical function, the metal pad 411 cannot be electrically connected to the bump pad 422 on the shortest route. Furthermore, due to the limitation of the entire metal circuit layer being on a same plane surface, the connecting circuit 431 travels through a circuitous route between the bump pad 422 and 423 to reach the bump pad 421.

SUMMARY OF THE INVENTION

The main object of the present invention is to provide a wafer level chip-scale package employing a metal wire to go across some connection traces from a metal pad and reach a bump pad in order to decrease the complexity of the circuit layout under a redistribution consideration.

The second object of the present invention is to provide a wafer level chip-scale package, which can shorten the routes of corresponding connection traces through by the replacements of metal wires to improve the electrical characteristics of the package on performance.

To achieve the foregoing objects of the present invention, a wafer level chip-scale package is disclosed. A chip includes a plurality of metal pads individually formed on each of the bonding pads. In the same metal circuit layer where metal pads exist, bump pads are arranged in a matrix configuration, wherein almost all of them are electrically connected one by one to bonding pads through connection traces. Bump pad isolated by lacking connection trace have an extension portion of itself, and the resilient passivation layer does not overlay the bump pad and extension portion. There is a metal wire used to connect the extension portion of the bump pad with the corresponding metal pad, which is also not overlaid by the resilient passivation layer. Therefore, the metal wire can directly cross over other connection traces to achieve the electrical connection on a shorter route.

BRIEF DESCRIPTION OF THE DRAWINGS

The invention will be described according to the appended drawings in which.

PREFERRED EMBODIMENT OF THE PRESENT INVENTION

Figure 1:
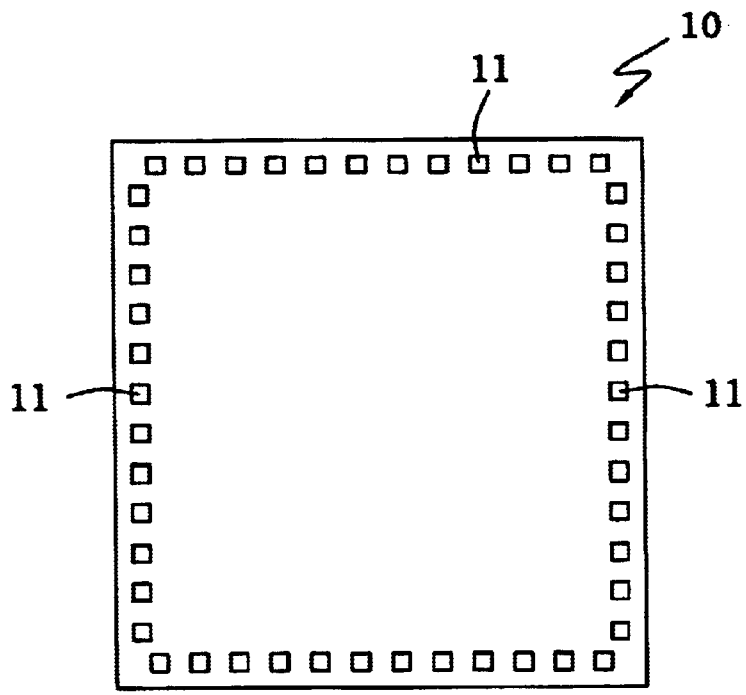
FIG. 1 is a diagrammatic top view of the bonding pad layout of a chip in a prior art.
Figure 2:
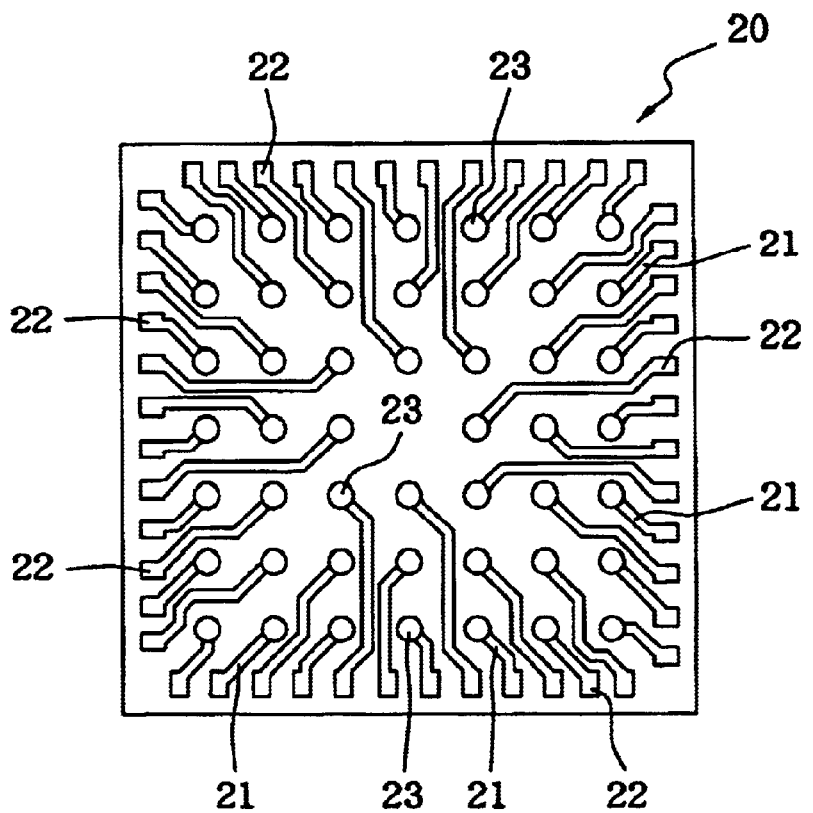
FIG. 2 is a diagrammatic top view of the I/O pad redistribution layout of a chip in a prior art.
Figure 3:
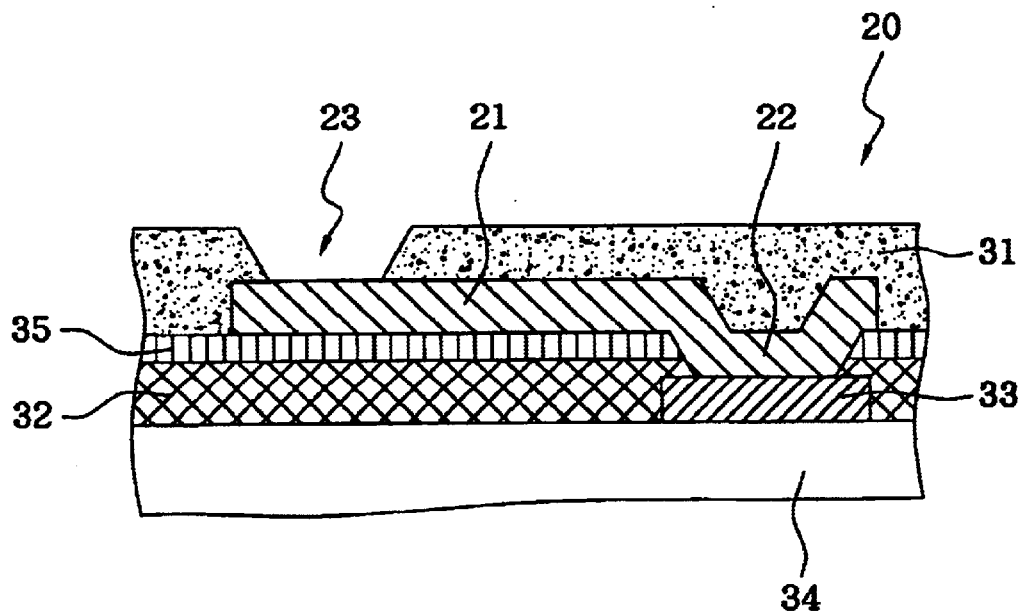
FIG. 3 is a diagrammatic cross-sectional view of FIG. 2.
Figure 4:
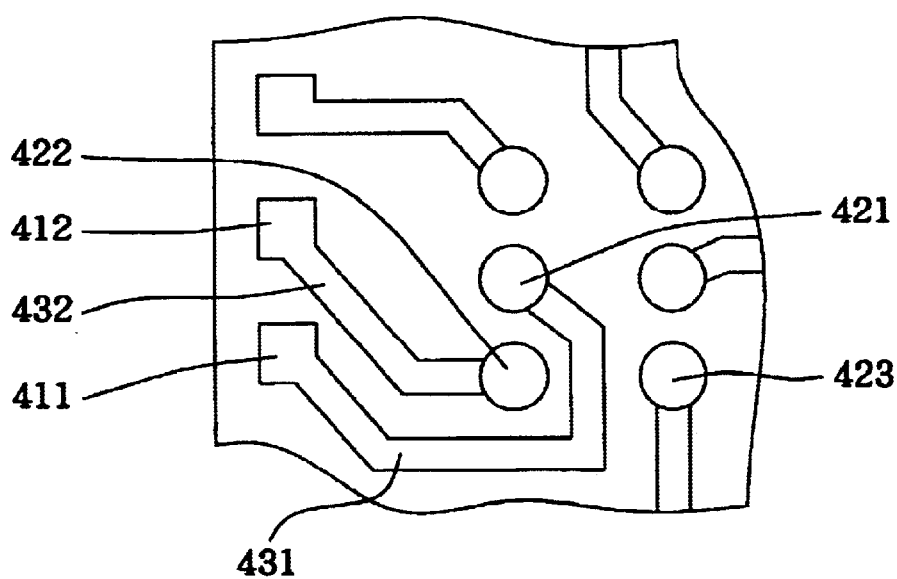
FIG. 4 is a diagrammatic partial view of the circuit in accordance with conventional bonding pad redistribution.
Figure 5:
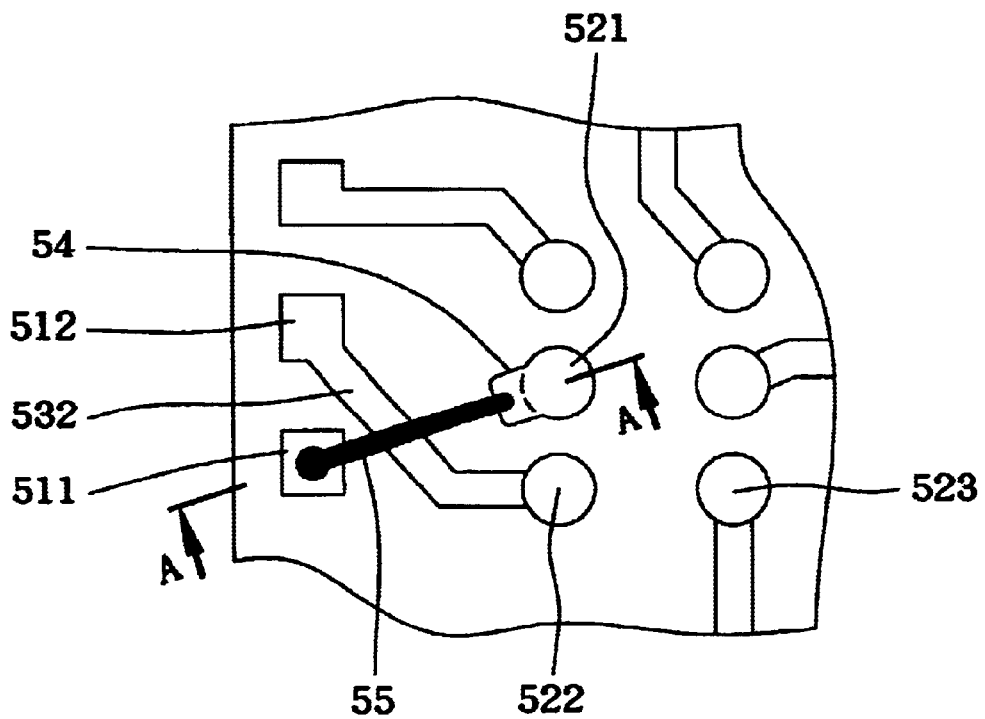
FIG. 5 is a diagrammatic view of a chip within the wafer level chip-scale package of a preferred embodiment in accordance with the present invention.

FIG. 5 is a diagrammatic cross-sectional view of a chip within the wafer level chip-scale package of a preferred embodiment in accordance with the present invention. A metal pad 512 is electrical connected to a bump pad 522 through a connection trace 532, and the metal pad 511 is electrically isolated from the same metal circuit layer due to lacking connection of connecting trace. An associated bump pad 521 is also without any connection trace connected therewith. The bump pad 521 has an extension portion 54 extending from itself toward the metal pad 511. A metal wire 55 is bonded on the metal pad 511 and the extension portion 54 with two ends of itself, wherein the bonding method takes advantage of the wire bonding technique to weld a gold wire or an aluminum wire on the surfaces of the metal pad 511 and the extension portion 54. Thus, the metal wire 55 is formed as a three-dimensional wire loop over a chip, and can directly cross over the connection trace 532 without a detour through the space between the bump pads 522 and 523.

Figure 6:
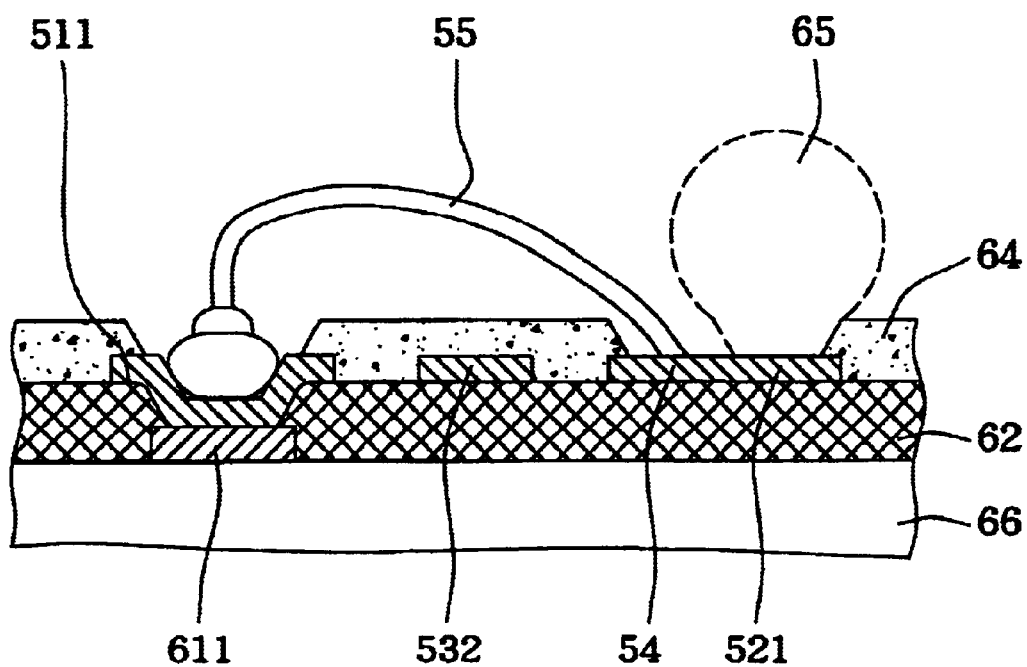
FIG. 6 is a diagrammatic cross-sectional view taken along the A—A line of FIG. 5.

FIG. 6 is a diagrammatic cross-sectional view taken along the A—A line of FIG. 5. The metal pad 511, the connection trace 532, the extension portion 54 and the bump pad 521 are on the same metal circuit layer over a chip 66. The forming processes of the metal circuit layer are similar to the processes of the under bump metallurgy in the flip-chip technique. There are three or four metal layers deposited above a bonding pad 611 and a passivation layer 62. That is, the connecting circuit 532, the extension portion 54 and the bump pad 521 are formed on the passivation layer 62 in the same process. Meanwhile, the metal pad 511 is also formed on the bonding pad 611.

A resilient passivation layer 64 is further provided on the metal circuit layer, and is usually made of polyimide or BCB (benzocyclobut-ene) to avoid any damage caused by a higher temperature when bumps 65, made from solder balls or copper rods, are welded on a substrate (not shown). On the other hand, the resilient passivation layer 64 can serve as a material having buffer and absorption functions against any external stress. The resilient passivation layer 64 has corresponding openings at the locations of the metal pad 511, the bump pad 521 and the extension portion 54, so that the metal wire 55 and the bump 65 can bond at each of the corresponding openings. Furthermore, the loop height of the metal wire is lower than the upmost height of the bumps.

The above-described embodiments of the present invention are intended to be illustrative only. Numerous alternative embodiments may be devised by persons skilled in the art without departing from the scope of the following claims.

What is claimed is:

1. A wafer level chip-scale package, comprising:
   a plurality of chips;
   a plurality of bonding pads formed on the plurality of chips;
   a passivation layer overlaid on the chips and adjacent to the bonding pads;
   a plurality of metal pads formed on the plurality of bonding pads;
   a plurality of first bump pads formed on the passivation layer;
   at least a second bump pad formed on the passivation layer and including an extension portion;
   a plurality of connection traces formed on the passivation layer for electrically connecting the metal pads and the first bump pads; and
   at least one metal wire crossing over the connection traces for electrically connecting the extension portion of the second bump pad and one of the metal pads.

2. The wafer level chip-scale package of claim 1, further comprising a resilient passivation layer overlaid on the connection traces.

3. The wafer level chip-scale package of claim 1, further comprising a plurality of bumps formed on the first bump pads and the second bump pad.

4. The wafer level chip-scale package of claim 3, wherein the bumps are solder balls.

5. The wafer level chip-scale package of claim 3, wherein the bumps are copper posts.

6. The wafer level chip-scale package of claim 1, wherein the first bump pads and the second bump pad are arranged in a matrix configuration.

7. The wafer level chip-scale package of claim 1, wherein the metal wire has one end to bond to the extension portion and the area of the extension portion is larger than the area of the cross-section of the end.

8. The wafer level chip-scale package of claim 1, wherein the loop height of the metal wire is lower than the upmost height of the bumps.

* * * * *